(12) United States Patent
Ribeiro et al.

(10) Patent No.: US 8,854,860 B2
(45) Date of Patent: Oct. 7, 2014

(54) METAL-INSULATOR TRANSITION LATCH

(75) Inventors: Gilberto Medeiros Ribeiro, Palo Alto, CA (US); Matthew D. Pickett, San Francisco, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 129 days.

(21) Appl. No.: 13/362,538

(22) Filed: Jan. 31, 2012

(65) Prior Publication Data

US 2013/0106480 A1 May 2, 2013

Related U.S. Application Data

(63) Continuation-in-part of application No. PCT/US2011/058461, filed on Oct. 28, 2011.

(51) Int. Cl.
G11C 11/00 (2006.01)
H03K 3/357 (2006.01)
H01L 45/00 (2006.01)
G11C 13/00 (2006.01)

(52) U.S. Cl.
CPC .............. *H01L 45/146* (2013.01); *H03K 3/357* (2013.01); *G11C 2211/5614* (2013.01); *H01L 45/04* (2013.01); *H01L 45/1233* (2013.01); *G11C 2213/15* (2013.01); *G11C 13/0007* (2013.01)
USPC ......................................................... 365/148

(58) Field of Classification Search
USPC ......................................................... 365/148
See application file for complete search history.

(56) References Cited

U.S. PATENT DOCUMENTS

| 3,670,313 A | 6/1972 | Beausoleil et al. |
| 3,708,690 A | 1/1973 | Paivinen |
| 3,760,382 A | 9/1973 | Itoh |
| 3,797,002 A | 3/1974 | Brown |
| 3,893,088 A | 7/1975 | Bell |
| 4,037,205 A | 7/1977 | Edelberg et al. |
| 4,133,043 A | 1/1979 | Hiroshima et al. |
| 4,322,635 A | 3/1982 | Redwine |
| 4,845,670 A | 7/1989 | Nishimoto et al. |
| 5,153,846 A | 10/1992 | Rao |

(Continued)

FOREIGN PATENT DOCUMENTS

| EP | 0827156 | 4/1998 |
| JP | 5066921 | 9/1993 |
| JP | 2005071500 | 3/2005 |

OTHER PUBLICATIONS

Chudnovskii, F.A. et al.; "Switching Phenomena in Chromium-doped Vanadium Sesquioxide"; (Research Paper); Journal of Applied Physics; Sep. 1, 1998; pp. 2643-2646; vol. 84; No. 5.; http://ieeexplore.ieee.org/xpl/freeabs_all.jsp?arnumber=5021804.

(Continued)

*Primary Examiner* — Huan Hoang
*Assistant Examiner* — Min Huang

(57) ABSTRACT

A metal-insulator transition (MIT) latch includes a first electrode spaced apart from a second electrode and an MIT material disposed between said first and second electrodes. The MIT material comprises a negative differential resistance (NDR) characteristic that exhibits a discontinuous resistance change at a threshold voltage or threshold current. Either the first or second electrode is electrically connected to an electrical bias source regulated to set a resistance phase of the MIT material.

19 Claims, 6 Drawing Sheets

(56) References Cited

U.S. PATENT DOCUMENTS

| | | | |
|---|---|---|---|
| 5,504,919 | A | 4/1996 | Lee et al. |
| 5,543,748 | A | 8/1996 | Ando |
| 5,698,997 | A * | 12/1997 | Williamson et al. ........... 326/134 |
| 5,930,323 | A | 7/1999 | Tang et al. |
| 6,061,417 | A | 5/2000 | Kelem |
| 6,239,638 | B1 | 5/2001 | Masuda |
| 6,362,660 | B1 | 3/2002 | Deng |
| 6,745,216 | B1 | 6/2004 | Nakamura |
| 6,834,005 | B1 | 12/2004 | Parkin |
| 7,051,153 | B1 | 5/2006 | Lin et al. |
| 7,508,701 | B1 | 3/2009 | Liang et al. |
| 7,573,310 | B2 | 8/2009 | Yang et al. |
| 7,608,849 | B2 | 10/2009 | Ino et al. |
| 7,728,327 | B2 | 6/2010 | Kim et al. |
| 7,791,376 | B2 | 9/2010 | Lim et al. |
| 7,983,068 | B2 | 7/2011 | Ufert |
| 2002/0089024 | A1 * | 7/2002 | Iwata ............................ 257/421 |
| 2005/0127524 | A1 * | 6/2005 | Sakamoto et al. ............ 257/774 |
| 2007/0080345 | A1 | 4/2007 | Joo et al. |
| 2007/0165446 | A1 * | 7/2007 | Oliva et al. ................... 365/154 |
| 2007/0267627 | A1 * | 11/2007 | Joo et al. ......................... 257/40 |
| 2009/0294869 | A1 * | 12/2009 | Chen ............................. 257/369 |
| 2010/0193824 | A1 * | 8/2010 | Kim et al. ....................... 257/98 |
| 2011/0106742 | A1 | 5/2011 | Pino |
| 2012/0138885 | A1 * | 6/2012 | Wu et al. ........................... 257/5 |

OTHER PUBLICATIONS

Youn, D.H. et al.; "Observation of Abrupt Metallic Transitions in p-Type GaAs Devices and Comparison with Avalanche Breakdown in the InGaAs APD"; (Research Paper); Journal of the Korean Physical Society; Jul. 1, 2005, pp. 1-5; vol. 47; No. 1; http://www.kps.or.kr/home/kor/journal/library/downloadPdf.asp?articleuid=%7BF70AB715-2A31-4C44-A52D-733D0D21B25C%7D.

Hikita, Y. et al.; "Negative Differential Resistance Induced by Mn Substitution at SrRuO3/Nb:SrTiO3 Schottky Interfaces"; (Research Paper); Journals of American Physical Society; Mar. 19, 2008; vol. 77; No. 20; http://prb.aps.org/abstract/PRB/v77/i20/e205330.

Chen, F. et al.; "S-shaped Negative Differential Resistance Modeling in Electro-thermal Simulation of Phase-change Memory Programming"; (Research Paper); Non-Volatile Memory Technology Symposium; Nov. 10-13, 2007; pp. 67-70; Albuquerque; http://ieeexplore.ieee.org/xpl/freeabs_all.jsp?arnumber=4389949.

Boriskov, P.P. et al.; "Metal-insulator Transition in Electric Field: a Viewpoint from the Switching Effect"; (Research Paper); Feb. 28, 2006; http://arxiv.org/pdf/condmat/0603132.

Chen-Yi Lee et al., "High-Speed Median Filter Designs Using Shiftable Content-Addressable Memory," IEEE Trans. Circuits and Systems for Video Tech., vol. 4, No. 6, Dec. 19.

Chudnovskiy, F. et al., "Switching Device Based on First-order Metalinsulator Transition Induced by External Electric Field," IEEE Future Trends in Microelectronics: the Nano.

PCT Search Report, PCT/US2011/058461, May 31, 2012.

Perez-Andrade, Roberto, et al., "A Versatile Linear Insertion Sorter Based on a FIFO Scheme," IEEE Computer Society Annual Symposium on VLSI, 2008, pp. 357-362.

Pickett et al., "Coexistence of Memristance and Negative Differential Resistance in a Nanoscale Metal-Oxide-Metal System," IEEE Advanced Materials, 2011, pp. 23, 1730-1733.

* cited by examiner

METAL-INSULATOR TRANSITION LATCH

RELATED APPLICATIONS

This application is a Continuation-in-Part of co-pending International Patent Application No. PCT/US2011/058461 entitled "Metal-Insulator Phase Transition Flip-Flop" filed Oct. 28, 2011, herein incorporated by reference.

BACKGROUND

Memory storage systems generally utilize latches or shift registers to store binary information. Often, a latch will associate a "1" when the latch experiences a high voltage or a "0" for lower voltages. A sequence of "1"s and "0"s can be arranged to store arbitrary data.

A latch's ability to switch between high and low voltage states affects the speed that a latch can operate. Also, changing between high and low voltages consumes energy. Usually, more energy is consumed when the voltage differential is high. Yet, statistically significant margins are used to differentiate between the high and low voltage states.

BRIEF DESCRIPTION OF THE DRAWINGS

The accompanying drawings illustrate various examples of the principles described herein and are a part of the specification. The illustrated examples are merely examples and do not limit the scope of the claims.

Throughout the drawings, identical reference numbers designate similar, but not necessarily identical, elements.

DETAILED DESCRIPTION

The present specification describes principles including, for example, a metal-insulator transition (MIT) latch with a first electrode spaced apart from a second electrode. An MIT material is disposed between the two electrodes and may, under some circumstances, electrically connect the electrodes. The MIT material has a negative differential resistance (NDR) characteristic that exhibits a discontinuous resistance change at a threshold voltage or threshold current.

The MIT material may be in either of two independent stable resistance states or phases depending on exposure to a transition temperature as will be discussed in detail below. One resistance phase is a metal phase in which the MIT material exhibits a low resistance similar to metals. The other resistance phase is an insulator phase in which the MIT material exhibits a resistance similar to insulators. Either electrode is electrically connected to an electrical bias source regulated to set a resistance state of the MIT material. Thus, the electrodes can be used to carry a current that heats the MIT material through the transition temperature. So long as the current is flowing and the corresponding increase in temperature applied, the change in the resistance phase of the MIT material is stable.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with the example is included in at least that one example, but not necessarily in other examples. The various instances of the phrase "in one example" or similar phrases in various places in the specification are not necessarily all referring to the same example.

Figure 1:
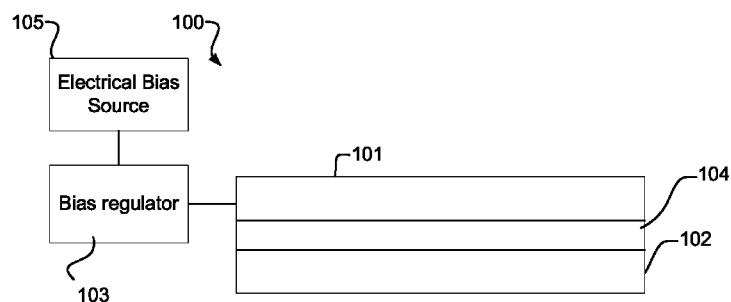
FIG. 1 is a diagram of an illustrative portion of an MIT latch, according to principles described herein.

FIG. 1 is cross sectional diagram of an illustrative portion of an MIT latch (100), according to principles described herein. The MIT latch (100) includes a first electrode (101) and a second electrode (102) that are separated from each other by an MIT material (104). In this example, the first electrode (101) is connected to an electrical bias source (105) regulated to control the temperature of the MIT material through Joule heating. The bias source (105) may be regulated by a regulator (103) that sets the latch's operational parameters, such as the internal temperature of the MIT material. The bias regulator (103) may be either a voltage regulator or a current regulator that may control the applied output of the bias source by regulating either the bias signal's voltage or current.

The MIT material (104) has an NDR characteristic that results in the MIT material exhibiting discontinuous changes in resistance at specific temperatures achieved at certain voltage or current ranges. The MIT material's characteristics provide unique properties where a voltage or current change may drive the MIT material to transition between resistance phases.

For example, the bias regulator (103) may control the voltage or current of the bias signal to be outside a voltage or current NDR range exhibited by the MIT material to set the operational parameters of the latch. To hold the operational parameters of the latch, the regulator (103) may adjust the signal to be within the voltage or current NDR range such that an internal temperature of the MIT material is close to a transition phase temperature, where the MIT material transitions from one resistance phase to another resistance phase. Near or at the phase transition temperature, the MIT material possesses characteristics that allow the MIT material to exhibit properties of either resistance phase. Adjusting the voltage or current applied to the MIT material outside of the NDR range may move the internal temperature of the MIT material past the transition temperature and result in the MIT material transitioning to a different resistance phase.

The MIT material may exhibit either of two independent stable resistance phases on either side of the transition temperature. As described above, one phase may be a metal phase that exhibits a resistance similar to metals, while the other phase may be an insulator phase that exhibits a resistance similar to insulators. In a certain temperature window at the transition temperature, the material can exhibit properties of either the metal or insulator phases. These phases may be stable binary states that may be used in memory and/or digital devices. For example, the resistive phases may be used to correspond to binary information, such as 0 or 1. By holding the bias signal within either the voltage or current NDR range, less energy may be used when the bias signal is adjusted to transition the MIT material's phase. However, the phases are easily differentiated from one another even when the internal temperature is held at or near transition temperature.

In some examples, the latch includes a two-terminal device in a Goto pair, shift register, memory circuit, delay circuit, or combinations thereof. In some examples, the electrodes may also be arranged on a common substrate.

Figure 2:
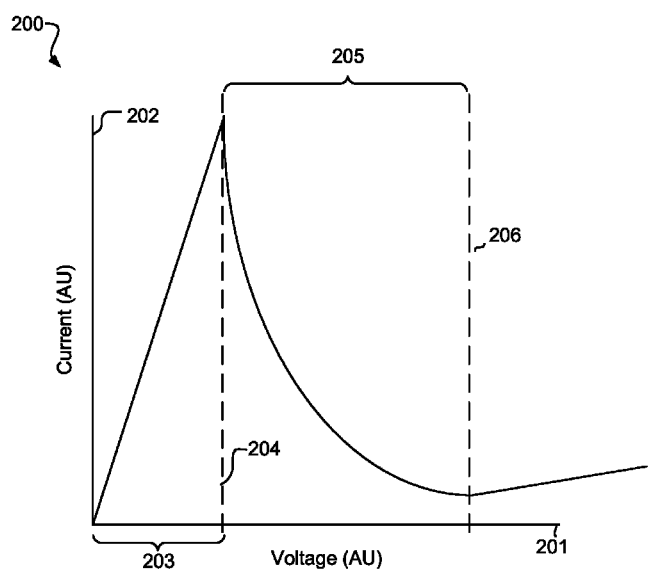
FIG. 2 is a diagram of a chart showing an illustrative N-NDR characteristic of a MIT material, according to principles described herein.

An example of an N-NDR characteristic is illustrated in a current voltage (IV) chart (200) of FIG. 2. The x-axis (201) represents voltage in arbitrary units, and the y-axis (202) represents current in arbitrary units. When a current passes from the first electrode to the second electrode through the MIT material within a low voltage range (203), the MIT material exhibits a positive relationship between the current and the voltage. As a greater voltage is applied to the MIT material, the amount of current passing through the MIT material also increases. However, when the voltage reaches a threshold voltage (204), the latch's resistance increases abruptly. In the example of FIG. 2, the current abruptly drops off as the voltage continues to increase within a NDR voltage range (205).

The IV relationship within the NDR voltage range (205) may not be linear. As shown in the example of FIG. 2, as the voltage increases, the current's drop rate may decrease until the voltage reaches a specific voltage (206) where the IV relationship becomes positive again. However, as shown in the example of FIG. 2, current continues to pass through the MIT material throughout the NDR voltage range (205). Thus, in the example of FIG. 2, the NDR characteristic does not completely stop current from flowing through the MIT material.

Thus, the MIT material in the example of FIG. 2 exhibits a metal to insulator phase transition. In other examples, the MIT material may have a more gradual metal to insulator phase transition.

Figure 3:
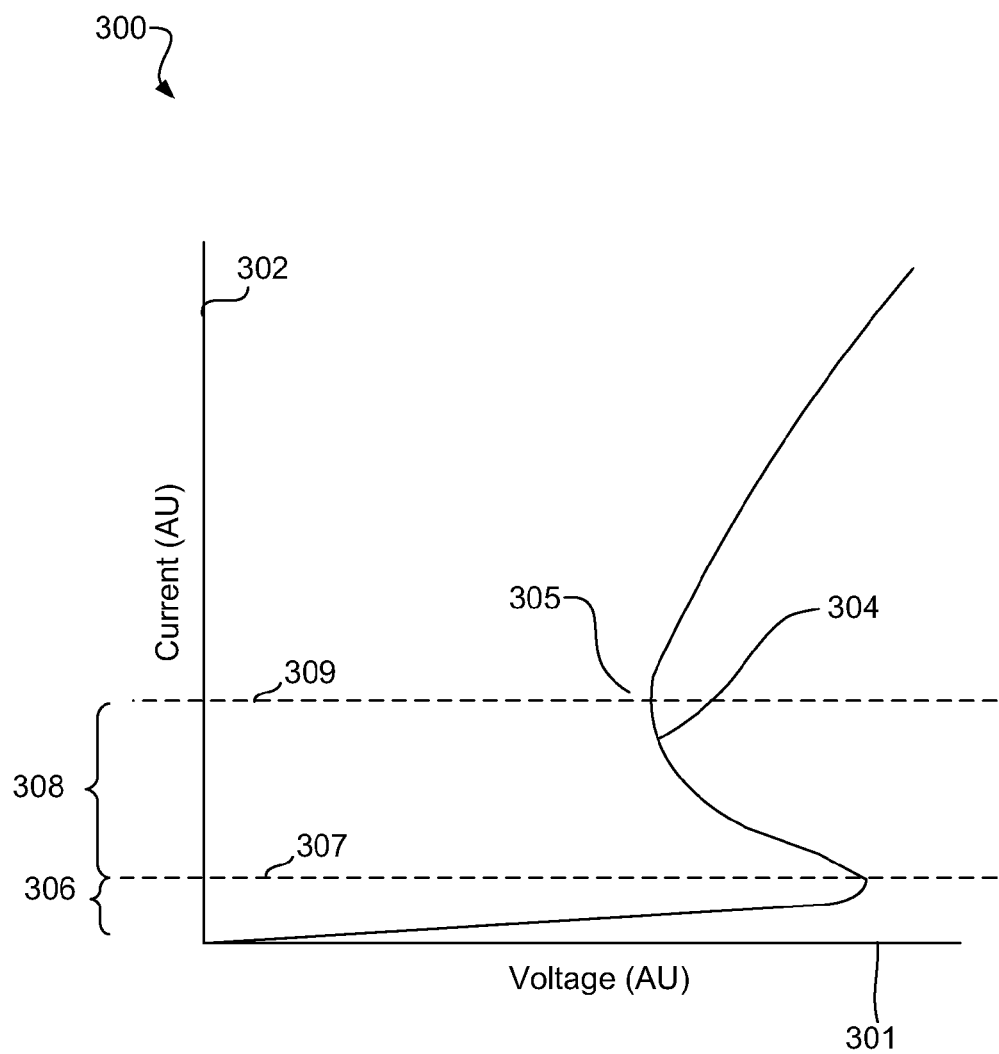
FIG. 3 is a diagram of a chart showing an illustrative S-NDR characteristic of a MIT material, according to principles described herein.

FIG. 3 illustrates an example of an S-NDR characteristic in an IV chart (300). The x-axis (301) schematically represents voltage in arbitrary units, and the y-axis (302) schematically represents current in arbitrary units. Current-voltage characteristics (304) include a low current range (306) where the differential resistance is positive. However, when the current reaches a threshold value which raises the internal temperature to the phase transition temperature (307), the voltage drops within a NDR current range (308). As the current increases, the current reaches another value (309), where the differential resistance is positive again.

Returning to FIG. 1, the MIT latch (100) may utilize an N-NDR or S-NDR characteristic to switch the MIT material (104) between metal and insulator phases by adjusting the amount of voltage or current applied to the MIT material (104).

For example, the power source (105) may supply a voltage to the MIT material within either the low voltage region or the NDR voltage region, such as regions (203, 205) illustrated in the example of FIG. 2. Generally, a signal applied to the MIT material that has a voltage within the low voltage region results in the MIT material being in the metal phase, and a signal applied to the MIT material that has a voltage beyond voltage region (206) corresponds to the insulator phase. Within the NDR region (205), the material is undergoing a metal-to-insulator phase transition, but may exhibit either a metallic or insulating phase. Each phase may be used by a memory storage device, like a latch, Goto pair, shift register, or combinations thereof, to represent binary information. As an example, the illustrative MIT latch (100) may use the metal phase to represent a "1," and use the insulator phase to represent a "0." As described in relation to FIG. 2, during the insulator phase, the MIT material continues to allow current to pass from the first electrode (101) to the second electrode (102); thus, the MIT latch (100) may be suitable for volatile memory applications where a continuous power is supply is used.

In another example, the power source (105) may supply a current to the MIT material within either the low current region or the NDR current region, such as regions (306, 308) illustrated in the example of FIG. 3. Generally, a signal applied to the MIT material that has a current within the low current region results in the MIT material being in the insulator phase, and a signal applied to the MIT material that has a current beyond current region (305) corresponds to the insulator phase. At the NDR region (308), the material is undergoing an insulator-to-metal phase transition, and can exhibit a metallic or insulating phase.

Figure 4:
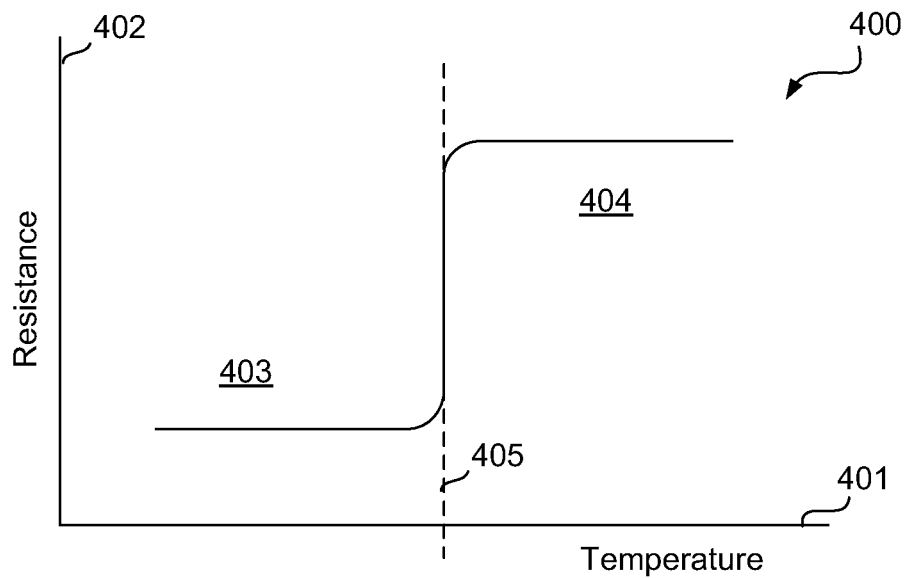
FIG. 4 is a diagram of a chart showing an illustrative thermal characteristic of a MIT material yielding N-NDR behavior, according to principles described herein.

The MIT material exhibits a thermal characteristic exhibited by abrupt changes in its resistance, leading to a metal to insulator phase transition at a certain temperature. FIG. 4 illustrates a chart (400) representing an example of a thermal characteristic of a MIT material. The x-axis (401) represents temperature, and the y-axis (402) represents electrical resistance. For low temperature, the MIT material of FIG. 4 exhibits low electrical resistance; therefore, the MIT material is in a metal phase (403). However, for high temperatures, the MIT material of FIG. 4 exhibits high electrical resistance; therefore, the MIT material is in an insulator phase (404). In the example of FIG. 4, the MIT material switches phases at a transition temperature (405).

At the transition temperature (405) of FIG. 4, an abrupt transition takes place from one phase to another. Chromium doped vanadium oxide or other transition metal oxides result in abrupt resistance changes, and as such, may be a suitable MIT material.

Figure 5:
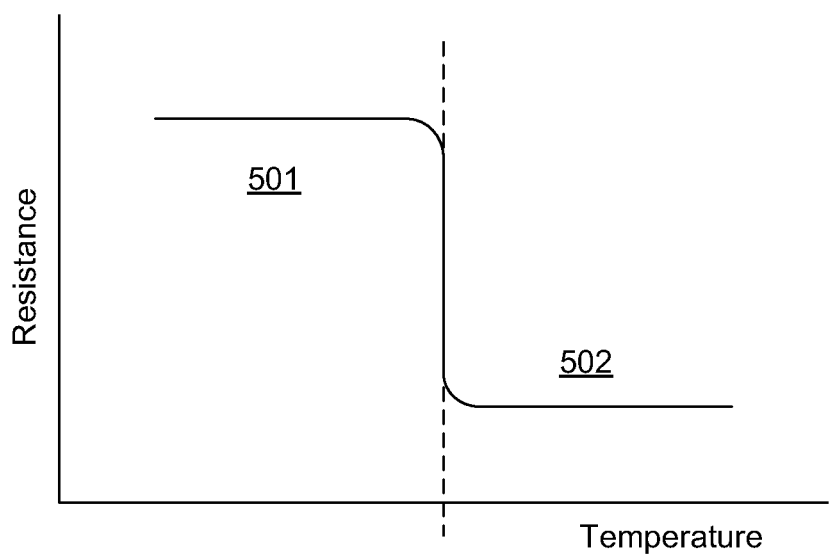
FIG. 5 is a diagram of a chart showing an illustrative thermal characteristic of a MIT material yielding S-NDR behavior, according to principles described herein.

FIG. 5 illustrates another example of a thermal characteristic that affects the material's resistance leading to a phase transition. In this example, the MIT material exhibits higher resistance at lower temperature where the MIT material exhibits the properties of an insulator phase (501). Conversely, the MIT material exhibits the properties of a metal phase (502) at higher temperatures.

Figure 6:
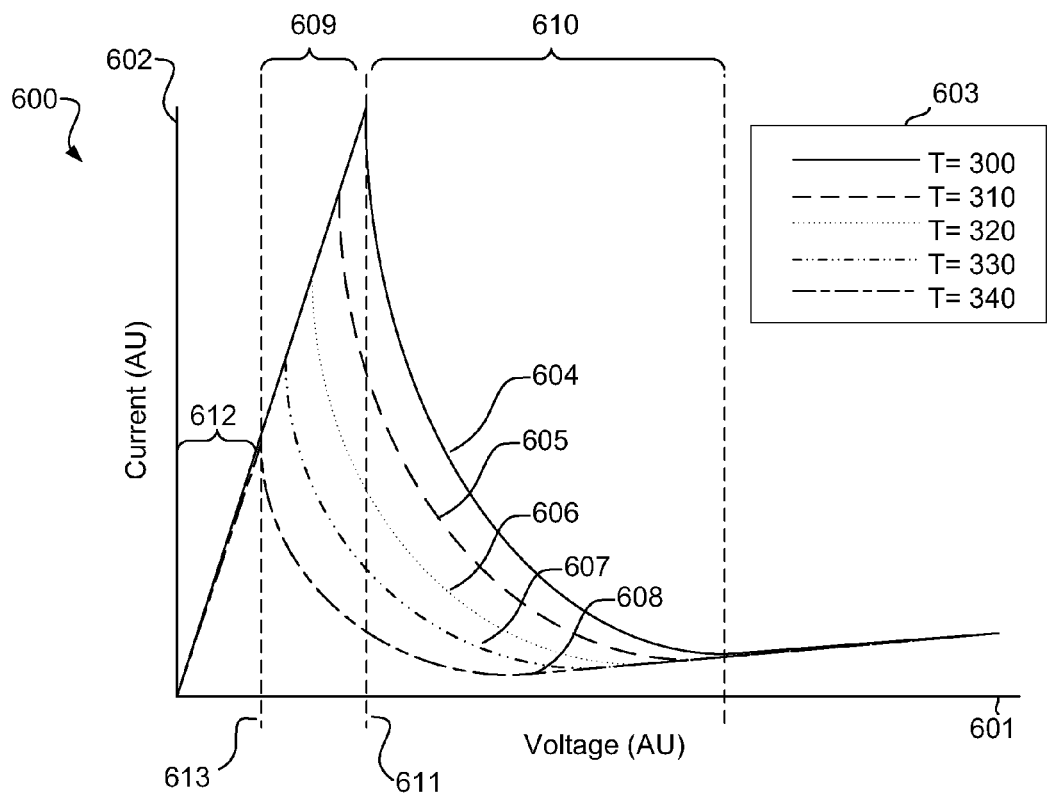
FIG. 6 is a diagram of a chart showing an illustrative power characteristic of an N-NDR device, according to principles described herein.

FIG. 6 is a diagram of a chart (600) that illustrates an example of a MIT material exhibiting N-NDR characteristics at several ambient, external temperatures. The x-axis (601) represents voltage in arbitrary units, and the y-axis (602) represents current in arbitrary units. A legend (603) associates each power curve (604, 605, 606, 607, 608) with a representative temperature.

IV curve (604) is associated with an external temperature of 300 arbitrary units. IV curve (604) shows a low voltage range (609) with a positive differential resistance and an NDR voltage range (610) with a negative differential resistance. IV curve (604) also shows a threshold voltage (611) between the low voltage range (609) and the NDR voltage range (610).

IV curve (608) is associated with a higher external temperature of 340 arbitrary units. While power curve (608) exhibits a similar positive relationship between current and voltage at lower voltages, its low voltage range (612) is smaller than low voltage range (609). Further, the threshold voltage (613) associated with IV curve (608) is also lower. IV curves (605, 606, 607) exhibit similar trends along a continuum between IV curve (604) and IV curve (608).

In the example of FIG. 6, the MIT material may switch from a metal phase to an insulator phase at a lower voltage as the external temperature increases. Thus, at higher external temperatures, less power may be used to transition between phases. As a consequence, at higher ambient temperatures, memory devices that store binary information may require less energy to switch phases. Further, minimizing the power differential between the phases may decrease the time that the MIT material takes to change from one arbitrary unit of temperature to next, thereby reducing the switching time.

The internal temperature of the MIT material may be controlled through a voltage bias. The bias energy is converted to heat through Joule heating. The voltage bias may be adjusted to control the MIT material's internal temperature to setting or holding the resistance states of the latch.

In some examples, the latch may be a level sensitive latch that includes set and reset operations. The voltage or current may be varied to set or reset the latch. The voltage or current may be held at a level that causes MIT material's internal temperature to at or near the transition temperature to hold the latch in either the set or reset state.

In constant power mode, the MIT material may exhibit an IV relationship that approximates $I=(T_{MIT}-T_{amb})/V*\alpha$, where I is current, V is voltage, $T_{MIT}$ is a transition temperature where the MIT material transitions from a metal phase to an insulator phase, $T_{amb}$ is an ambient internal temperature, and $\alpha$ is the effective thermal resistance of the latch.

Figure 7:
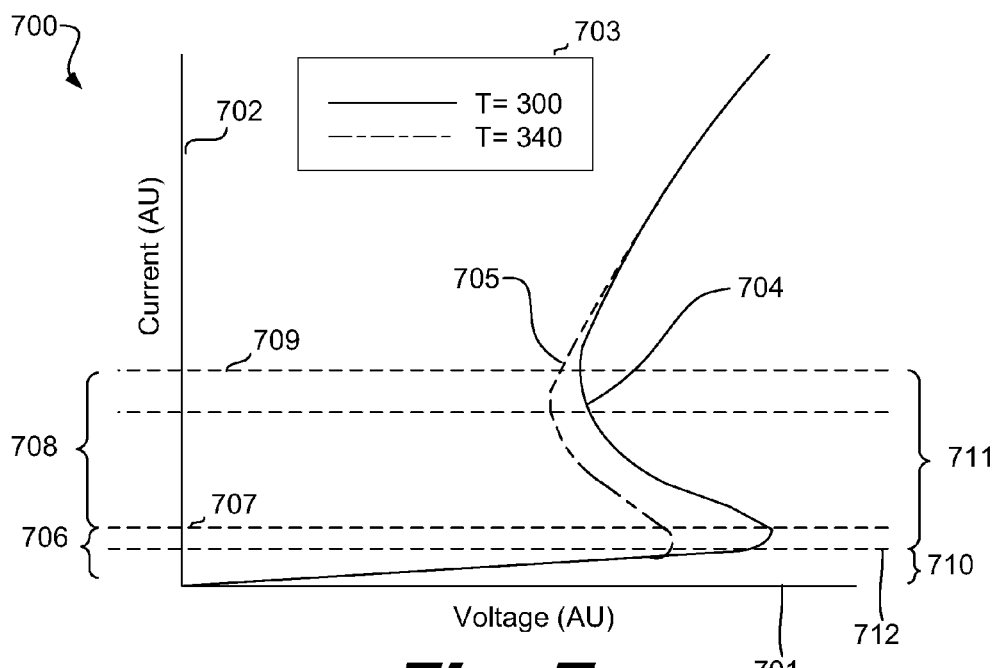
FIG. 7 is a diagram of a chart showing an illustrative power characteristic of an S-NDR device, according to principles described herein.

An example of S-NDR IV characteristics is illustrated in chart (700) of FIG. 7. The x-axis (701) represents voltage in arbitrary units, and the y-axis (702) represents current in arbitrary units. A legend (703) associates each IV curve (704, 705) with a representative ambient temperature.

IV curve (704) is associated with a temperature of 300 arbitrary units. IV curve (704) shows a low current range (706) where the differential resistance is positive. However, when the current reaches a threshold current (707), the voltage drops and as a consequence the latch exhibits its NDR behavior (708) due to the MIT material. At the NDR region, the material is undergoing an insulator-to-metal phase transition. As the current increases, (709), the differential resistance becomes positive again.

IV curve (705) is associated with an external temperature of 300 arbitrary units. IV curve (705) also shows a low current range (710) and an NDR range (711). However, low current range (710) is smaller than low current range (706). Thus, the threshold current (712) of IV curve (705) is lower than the threshold current (707) of IV curve (704).

The example of FIG. 7 illustrates an MIT material that exhibits an S-NDR characteristic with a thermal characteristic that allows the MIT material to transition between metal and insulator phases at lower power levels. Thus, latches utilizing this type of MIT material may also achieve lower switching powers and save energy. The internal temperature of a MIT material illustrated in the chart 700 of FIG. 7 may be controlled with a regulated current bias.

Figure 8:
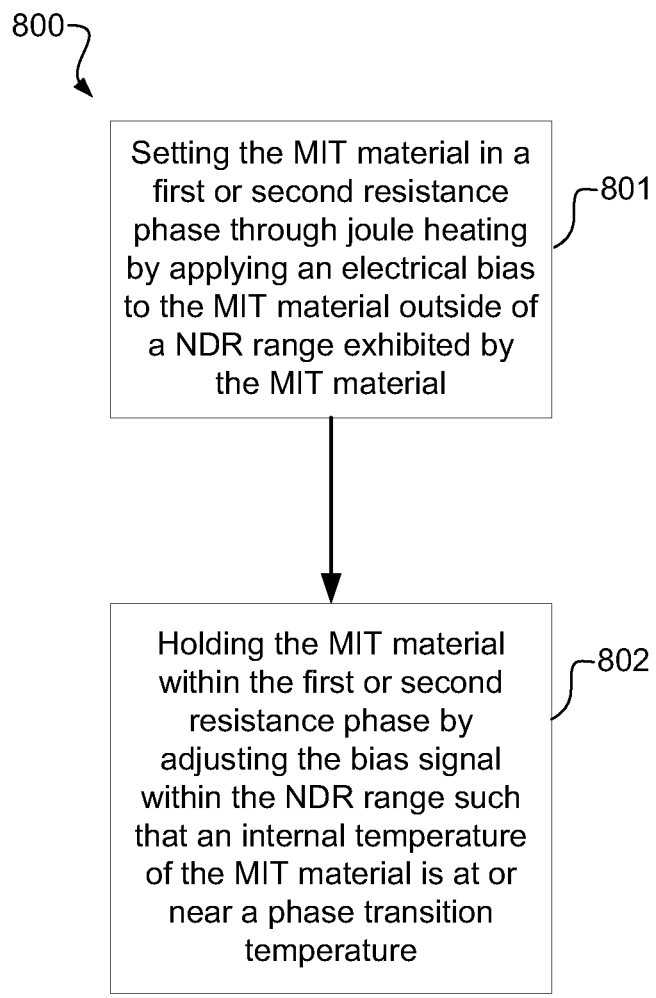
FIG. 8 is a diagram for controlling a latch, according to principles described herein.

FIG. 8 is a flowchart (800) that depicts an illustrative method for controlling a latch. The method may include setting (801) the MIT material in a first or second resistance phase through joule heating by applying an electrical bias to the MIT material outside of a negative differential resistance (NDR) range exhibited the MIT material and holding (802) the MIT material within the first or second resistance phase by adjusting the bias signal within the NDR range such that an internal temperature of the MIT material is at or near a phase transition temperature. The first and second resistance phases may be binary states. The NDR range may be a voltage NDR range or a current NDR range.

The method may further include regulating the bias signal to apply a consistent bias. This regulation may cause a consistent current or a consistent voltage to be applied to the MIT material. For the N-NDR examples, the voltage of the bias signal may control the joule heating, while for the S-NDR examples, the current of the bias signal may control the joule heating.

In some examples, the voltage is increased in the bias signal to reach the threshold voltage. In alternative examples, the current in the bias signal is increased to the reach the threshold current.

Figure 9:
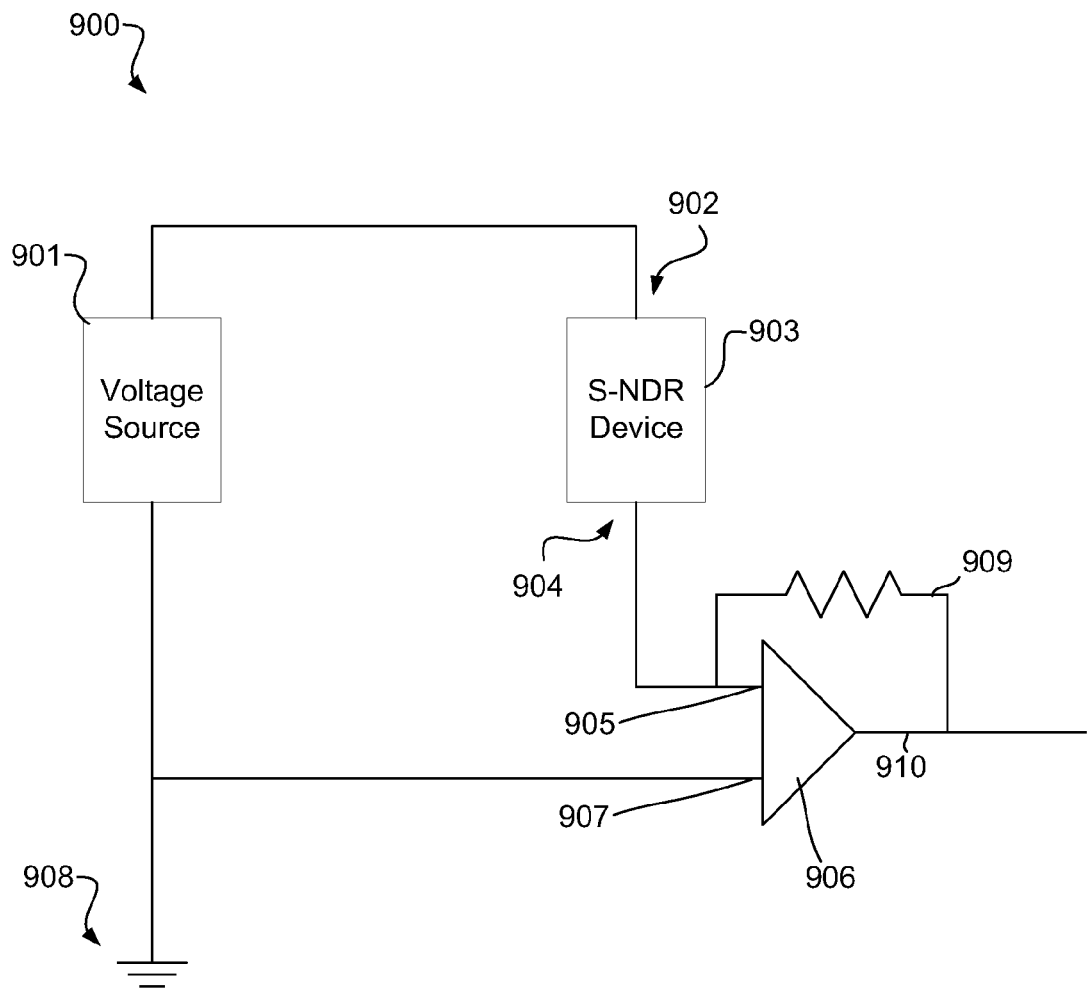
FIG. 9 is a diagram of an illustrative circuit that utilizes MIT material.

FIG. 9 is a diagram of an illustrative circuit (900) that utilizes MIT material. In this example, a voltage source (901) is in communication with a first electrode (902) of a latch (903) that comprises the MIT material. A second electrode (904) of the latch (903) is in electrical communication with a first input (905) of an operational amplifier (906). A second input (907) of the operational amplifier (906) is in electrical communication with ground (908). A resistive feedback (909) connects an output (910) of the operational amplifier (906) to the first input (905).

In this example, the MIT material may exhibit a NDR characteristic similar to that described in relation to the example of FIG. 3. In the example of FIG. 9, the voltage source (901) may apply a voltage to the latch (903) that raises the MIT material's internal temperature past the transition temperature and generates a current greater than the current NDR range. Such a signal may is set the MIT material in a metal phase. Once the metallic phase is set, the voltage signal may be adjusted such that the current of the signal falls within the NDR range bring the internal temperature closer to the transition temperature. However, within the current NDR range, the MIT material may exhibit either a stable metallic or a stable insulator phase.

In the metallic phase, the MIT material may conduct the signal from the voltage source (901) to the first input (905) with little resistance, thus conducting a greater value of current. Since the second input (907) is grounded, the signal passing through the latch (903) may be amplified by the operational amplifier. The particular signal that is outputted from the amplifier (906) may correspond to binary information. The output (910) of the operational amplifier (910) may be in electrically communication with delay circuitry, memory circuitry, other latch circuitry, shift registers, Goto pairs, other circuitry, or combinations thereof.

To reset the output of the amplifier (906), the voltage signal may be adjusted to transition the phase of the MIT material to exhibit insulator properties. This may be accomplished by lowering the voltage such that the current generated in the signals drops below the current NDR range. Since the insulator phase still conducts a small current, transitioning to the insulator phase does not break the circuit. To hold the MIT material in the insulator phase, the signal may be adjusted again such that the current of the signal is within the current NDR range.

In the insulator phase, the MIT material may restrict the amount of current that is conducted through the latch (903). As a consequence, the signal that reaches the first input may be distinctly different than when the MIT material was in the metal phase. Thus, the amplifier's output may be distinctly identifiable and may represent a 0 or 1 in a binary code.

Finally, the feedback resistor (909) sets the output voltage, which can be the input of another latch or any other circuitry.

In some examples, the latch may be used in compact applications because the phase transition characteristics of the MIT material are bulk properties that may be independent of the physical sizes of the latch's components. Thus, a latch, made in accordance with the principles described herein, may have a reduced size and enable a smaller footprint for associated circuitry.

In some examples, the latch's components may be placed on top of a complementary metal oxide semiconductor (CMOS) circuit or any electrically insulating substrate. In some examples, the MIT material may be deposited on a substrate through shadow masking or depositing a layer and etching a strip of MIT material.

In some examples, the MIT material may be a metal selected from a group consisting of niobium, titanium, tungsten, manganese, iron, vanadium, oxides thereof, nitrides thereof, doped alloys thereof, and combinations thereof. In some examples, the MIT material includes chromium doped vanadium oxide.

In some examples, the MIT material or other components of the latch may expand as their internal temperature increase, which may open gaps in the latch. These gaps may interfere with the electrical conductivity of the overall circuit, thereby, increasing the circuit's electrical resistance. In some examples, the gaps are molecular gaps formed in the MIT material. This volume characteristic may contribute, in part, to transitioning between metal and insulator phases.

In some examples, the transition characteristic of the MIT material is affected by how quickly the majority of the MIT material's volume transitions between phases. In some examples, the MIT material's volume may transition to another phase at an initial location and propagate from there. In alternative examples, the several discrete locations within the MIT material may independently transition to the other phase and propagate from each discrete location. Multiple initial phase transitions locations may result in a quicker overall transition such that the MIT material thereby exhibits a more abrupt transition between phases.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A metal-insulator transition (MIT) latch, comprising:
a first electrode spaced apart from a second electrode;
an MIT material disposed between said first and second electrodes;
said MIT material comprising a negative differential resistance (NDR) characteristic that exhibits a discontinuous resistance change at a threshold voltage or threshold current; and
at least said first or said second electrode is electrically connected to an electrical bias source regulated to set a resistance phase of said MIT material by applying a bias signal outside of a NDR range and to hold said MIT material within said stable resistance phase by adjusting said bias within said NDR range;
wherein said MIT material exhibits an current/voltage relationship that follows $I=(T_{MIT}-T_{amb})/V*\alpha$, where I represents current, V represents voltage, $T_{MIT}$ represents a transition temperature where said MIT material transitions from a metal phase to an insulator phase, $T_{amb}$ represents an ambient internal temperature, and $\alpha$ represents the effective thermal resistance of the latch.

2. The latch of claim 1, wherein said electrical bias source comprises a current regulator.

3. The latch of claim 1, wherein said electrical bias source comprises a voltage regulator.

4. The latch of claim 1, wherein said first and second electrodes are part of a two terminal device.

5. The latch of claim 1, wherein said MIT material is incorporated into a shift-register, Goto pairs, delay circuit, or combinations thereof.

6. The latch of claim 1, wherein said MIT material is incorporated into volatile memory storage.

7. The latch of claim 1, wherein said MIT material also comprises a thermal characteristic exhibited by said MIT material transiting phases quicker when said bias source applies a signal outside of said NDR range when said MIT material has a higher internal temperature.

8. A method for controlling a latch comprising:
setting a metal-insulator transition (MIT) material in a first or second resistance phase through joule heating by applying an electrical bias to said MIT material outside of a negative differential resistance (NDR) range exhibited by said MIT material, said MIT material being between a first electrode and a second electrode; and
holding said MIT material within said first or second resistance phase by adjusting said bias signal within said NDR range such that an internal temperature of said MIT material is at or near a phase transition temperature.

9. The method of claim 8, wherein said NDR range is a voltage range.

10. The method of claim 8, wherein said NDR range is a current range.

11. The method of claim 8, wherein said first and second resistance phases are binary states.

12. The method of claim 8, wherein said first and second electrodes are part of a two terminal device.

13. A latch comprising:
a first electrode spaced apart from a second electrode;
said first and second electrodes are electrically connected through a metal-insulator transition (MIT) material;
said latch comprising two stable resistance phases within a negative differential resistance (NDR) range exhibited by said MIT material;
said MIT material also comprises a thermal characteristic exhibited by said MIT material transiting phases when said bias source applies a signal outside said NDR range;
at least said first or said second electrode being electrically connected to an electrical bias source; and
said electrical bias source regulated to set said MIT material within either stable resistance phase by applying a bias signal outside of said NDR range and to hold said MIT material within either stable resistance phase by adjusting said bias within said NDR range.

14. The latch of claim 13, wherein said electrical bias source comprises a current regulator.

15. The latch of claim 13, wherein said electrical bias source comprises a voltage regulator.

16. The latch of claim 1, wherein said first electrode or said second electrode is placed on top of a complementary oxide semiconductor circuit.

17. The latch of claim 1, wherein said first electrode or said second electrode is connected to an operational amplifier.

18. The latch of claim 1, wherein said MIT material exhibits a N-type NDR characteristic.

19. The latch of claim 1, wherein said MIT material comprises a characteristic where less time is consumed in switching between said first and second electrical phases as an internal temperature of said MIT material increases.

* * * * *